(12) United States Patent
Zhou et al.

(10) Patent No.: US 9,910,107 B2
(45) Date of Patent: Mar. 6, 2018

(54) PATTERNED MAGNETORESISTIVE (MR) DEVICE WITH ADJACENT FLUX ABSORBING STRIPES

(71) Applicant: Headway Technologies, Inc., Milpitas, CA (US)

(72) Inventors: Yuchen Zhou, San Jose, CA (US); Yimin Guo, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/926,069

(22) Filed: Oct. 29, 2015

(65) Prior Publication Data
US 2016/0047865 A1    Feb. 18, 2016

Related U.S. Application Data

(62) Division of application No. 14/245,641, filed on Apr. 4, 2014, now Pat. No. 9,188,650, and a division of
(Continued)

(51) Int. Cl.
*G01R 33/09* (2006.01)
*G11B 5/39* (2006.01)
(Continued)

(52) U.S. Cl.
CPC ............ *G01R 33/093* (2013.01); *B82Y 25/00* (2013.01); *B82Y 40/00* (2013.01); *G01R 33/09* (2013.01);
(Continued)

(58) Field of Classification Search
CPC .... G01R 33/09; G01R 33/091; G01R 33/093; B82Y 25/00; B82Y 40/00;
(Continued)

(56) References Cited

U.S. PATENT DOCUMENTS 4,847,584 A    7/1989  Pant
5,247,278 A    9/1993  Pant et al.
(Continued)

OTHER PUBLICATIONS

"Factors affecting the performance of a thin film magnetoresistive vector magnetometer," G. R. Hoffman et al., Journal of Applied Physics, 53(11), Nov. 1982, 1982 American Institute of Physics, pp. 8266-8268.
(Continued)

*Primary Examiner* — Jay Patidar
(74) *Attorney, Agent, or Firm* — Saile Ackerman LLC; Stephen B. Ackerman (57) ABSTRACT

A magnetic sensor with increased sensitivity, lower noise, and improved frequency response is described. The sensor's free layer is ribbon shaped and is closely flanked at each long edge by a ribbon of magnetically soft, high permeability material. Side stripes of soft magnetic material absorb external field flux and concentrate the flux to flow into the sensor's edges to promote larger MR sensor magnetization rotation. Side stripes are located in the plane of the free layer at a maximum distance of 0.1 microns from each side of the free layer. The free layer has a width <300 nm, a length of >1 micron, and an aspect ratio (thickness/width) of at least 5. Preferably, $M_{film}t_{film} > M_{free}t_{free}$, where $M_{film}$ and $M_{free}$ are the magnetization of the soft magnetic layers and free layer, respectively, and $t_{film}$ and $t_{free}$ are the thickness of the soft magnetic layers and free layer, respectively.

9 Claims, 7 Drawing Sheets

Related U.S. Application Data application No. 12/012,667, filed on Feb. 5, 2008, now Pat. No. 8,711,524.

(51) Int. Cl.
 *B82Y 25/00* (2011.01)
 *B82Y 40/00* (2011.01)
 *H01F 10/32* (2006.01)
 *H01F 41/30* (2006.01)

(52) U.S. Cl.
 CPC .......... *G01R 33/091* (2013.01); *G11B 5/3906* (2013.01); *G11B 5/398* (2013.01); *G11B 5/3925* (2013.01); *H01F 10/325* (2013.01); *H01F 10/3254* (2013.01); *H01F 41/302* (2013.01); *G11B 2005/3996* (2013.01)

(58) Field of Classification Search
 CPC .......... G11B 2005/3996; G11B 5/3906; G11B 5/3925; G11B 5/398; H01F 10/325; H01F 10/3254; H01F 41/302
 USPC ............................ 324/207.21, 252, 210–212
 See application file for complete search history.

(56) References Cited

U.S. PATENT DOCUMENTS

| | | | |
|---|---|---|---|
| 6,064,552 A * | 5/2000 | Iwasaki | B82Y 10/00 360/321 |
| 6,873,499 B2 | 3/2005 | Lee et al. | |
| 7,016,166 B1 | 3/2006 | Hou et al. | |
| 7,203,039 B2 | 4/2007 | Wang et al. | |
| 7,283,336 B2 | 10/2007 | Gill | |
| 2006/0114617 A1 * | 6/2006 | Nikitin | B82Y 10/00 360/324.1 |

OTHER PUBLICATIONS

"Barkhausen Noise in Thin-Film Recording Heads," by K. B. Klassen et al., IEEE Transactions on Magnetics, vol. 26, No. 5, Sep. 1990, pp. 1697-1699.

"Effect of Interstrip Gap on the Sensitivity of High Sensitivity Magnetoresistive Transducers," by Bharat B. Pant, Journal of Applied Physics, 79(8), Apr. 15, 1996, 1996 American Institute of Physics, pp. 6123-6125.

* cited by examiner

PATTERNED MAGNETORESISTIVE (MR) DEVICE WITH ADJACENT FLUX ABSORBING STRIPES

This is a Divisional application of U.S. patent application Ser. No. 14/245,641, filed on Apr. 4, 2014 which is a divisional application of U.S. patent application Ser. No. 12/012,667, filed on Feb. 5, 2008, which are herein incorporated by reference in their entirety, and assigned to a common assignee.

FIELD OF THE INVENTION

The invention relates to the general field of magnetic sensors with particular reference to improving their sensitivity, frequency response, and noise level.

BACKGROUND OF THE INVENTION

Magneto-resistive (MR) thin film sensors used for low field sensing applications usually take the form of long stripes with a width of several microns and a length of tens of microns, up to about 100 microns as disclosed in U.S. Pat. No. 4,847,584 and U.S. Pat. No. 5,247,278, and described by G. Hoffman and J. Birtwistle in "Factors affecting the performance of a thin film magnetoresistive vector magnetometer," *J. Appl. Phys.*, vol. 53, pp. 8266-8268, November 1982.

With such a large aspect ratio, the shape anisotropy of the long stripe helps to maintain the magnetic domain structure within the sensing layer of the device (which has a thickness of <10 nm in most cases). Prior work by B. Pant described in "Effect of interstrip gap on the sensitivity of high sensitivity magnetoresistive transducers," *J. Appl. Phys.*, vol. 79, pp. 6123-6125, April 2006, also shows that reducing the gap between adjacent stripe patterns can help alleviate the "stiffness" of the sensor caused by the shape anisotropy of the long stripe. Thus, the sensitivity of the multi-stripe sensor array can be improved, as we will discuss below.

A routine search of the prior art was performed with the following additional references of interest being found. U.S. Pat. No. 7,283,336 shows a single-domain free layer having a bias field at side edges of the read sensor. U.S. Pat. No. 7,203,039 discloses an additional layer of soft magnetic material abutting hard biasing layers to prevent flux leakage. U.S. Pat. No. 7,016,166 shows biasing structures abutting each side of the single domain MR structure. U.S. Pat. No. 6,873,499 shows flux guides abutting the read sensor.

SUMMARY OF THE INVENTION

One objective of the present invention is to provide a MR sensor having a linear response due to uniform rotation of its free layer magnetization.

Another objective of at least one embodiment of the present invention is to provide a MR sensor exhibiting minimal low frequency noise due to a single domain free layer.

Still another objective of at least one embodiment of the present invention is to provide a MR sensor wherein field concentration and demagnetization cancellation by neighboring soft magnetic patterns are not limited by the MR sensor's free layer's properties so that the free layer can be independently optimized to increase the sensitivity of the MR sensor.

A further object of at least one embodiment of the present invention is to improve the sensitivity to magnetic fields of a MR sensor.

These objectives have been achieved with a sensor that has a free layer in the shape of a long ribbon having an aspect ratio greater than about 3, and preferably greater than 5, and a width (which coincides with the direction of the field to be sensed) that is less than the exchange length of the free layer material. The free layer may be part of an AMR, GMR, or TMR device.

Concentration of flux from sources external to the free layer is enhanced by a pair of soft magnetic ribbons located at the sides of the MR sensor in close proximity to the sensor's long edges.

This side pattern acts as a magnetic flux bridge that absorbs field flux, concentrating it to flow into the MR sensor edges to promote larger MR sensor magnetization rotation. For such an effect to work efficiently, high permeability material is preferred. Also, close proximity of the structure to the MR sensor edge, higher moment of the structure material relative to the MR sensor free layer as well as the physical shape of the structure are all factors that help to concentrate the flux.

DESCRIPTION OF THE PREFERRED EMBODIMENTS

Due to the large size of prior art sensing devices, domains in a free layer have a minimum dimension of about 1 µm. This is much larger than the exchange length of typical free layer material (200 nm-300 nm). Consequently, the presence of domains can be expected in these prior art sensors. To achieve stable and linear response from a MR device, the magnetization response to an external field is preferably due to a gradual magnetization rotation of the free layer in the applied field direction as in normal MR sensors used in hard disk drive heads. Magnetization switching through domain movement in the free layer, however, is very sensitive to the external field because of the lower energy needed to move a magnetization vortex, and is also intrinsically non-linear and very noisy.

For example, Barkhausen noise resulting from domain motion in the presence of an applied field as described by K. B. Klaassen and van Peppen in "Barkhausen noise in thin-film recording heads," *IEEE Trans. on Magn.*, vol. 26, pp. 1697-1699, September 1990, may lead to significant low frequency noise and signal level uncertainty. Thus, although the sensitivity of domain movement is high, the noise that it causes offsets the gain of the high sensitivity and produces an effectively low SNR sensor. For accurate and high sensitivity field sensing, a single domain free layer should be the best situation. This requirement will need the minimal dimension of the field sensor, i.e. width of the sensor in most cases, to be shorter than the exchange length of the free layer material. Thus, a sensor width of less than 300 nm would be the most suitable.

Insufficient demagnetization field cancellation is another concern. For a high length-over-width aspect ratio sensor, as required for a single domain free layer design, the shape anisotropy along the length direction could be high enough to cause sensitivity loss, especially in the low field case. In a prior study by B. Pant described in "Effect of interstrip gap on the sensitivity of high sensitivity magnetoresistive transducers," *J. Appl. Phys.*, vol. 79, pp. 6123-6125, April 2006, sensor stripes were arranged closer to each other so that the edge charges from sensors helped to offset the demagnetization field in their neighboring sensors.

However, using a neighboring sensor's free layer to offset the demagnetization field is not a very efficient way to enhance the sensitivity of a stripe type field sensor. The reason is that the MR sensor free layer is usually very thin, which requires very close proximity between the sensors to actually utilize the neighboring charges. For a free layer with a 10 nm thickness, the expected proximity should be around the same scale, i.e. 10 nm, which is very hard to manufacture.

Use of adjacent soft material to enhance sensitivity by absorbing the meager flux of the magnetic field to be sensed by the soft material and then re-concentrating that flux in the sensor free layer could theoretically lead to a higher rotation of the free layer's magnetization. This flux concentration effect is preferably achieved through some individual neighboring single layer magnetic structures rather than through the MR sensor itself. In this way, the flux concentration effect will not be limited by the free layer's thickness, magnetic moment, and material properties. Such a single layer structure at the side of the MR sensor may be comprised of uniformly constituted magnetic material having higher moment than the sensor's free layer, as well as high permeability and low coercivity.

The present disclosure features a MR sensor in a single domain state without forming domain walls in the sensor's free layer, and is not limited to a specific MR sensor configuration, but rather any MR sensor with a magnetic free layer. With a single domain, free layer magnetization undergoes uniform rotation in the presence of an external field to produce a linear response. Also in the single domain state, various noises of magnetic origin can be effectively eliminated or reduced. However, due to the single domain requirement, the sensor width, which coincides with the direction of the field to be sensed, needs to be less than the exchange length of the free layer material.

An important feature of the invention is the utilization of patterned soft magnetic material located at the sides of the MR sensor (stripe) in close proximity to the sensor's long edges. This side pattern absorbs external field flux, concentrating it to flow into the MR sensor edges to promote larger MR sensor magnetization rotation. For such an effect to work efficiently, high permeability material is preferred. Also, close proximity of the structure to the MR sensor edge, higher moment of the structure material relative to the free layer as well as the physical shape of the structure are all factors that help to concentrate the flux, as will be detailed in the embodiments presented below.

Figure 1A:
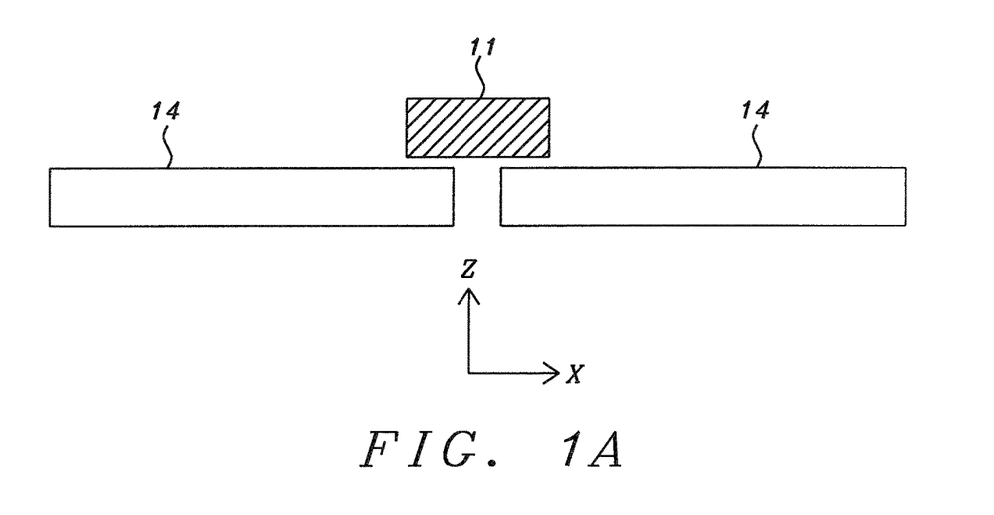
FIGS. 1A and 1B illustrate the basic principle of the invention and compare the degree of magnetization rotation with and without the presence of patterned soft magnetic material located at the sides of a MR sensor.
Figure 1B:
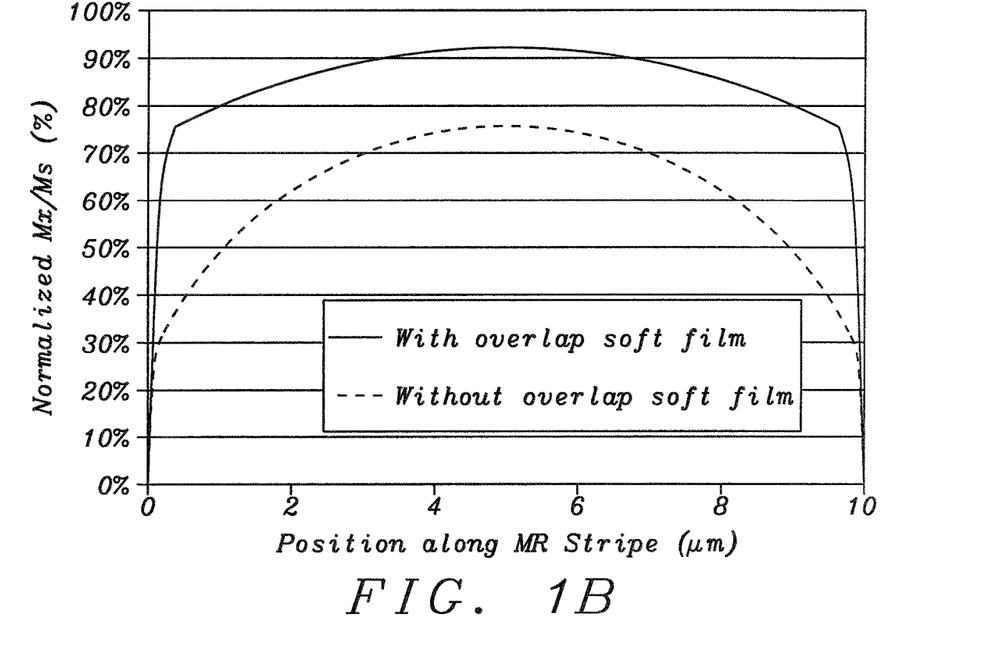

FIGS. 1A-1B show a comparison of simulated effective magnetization rotation of the MR sensor free layer along the applied field direction, with and without the neighboring soft magnetic film of the invention. FIG. 1A shows the sensor structure that was simulated. For simulation purposes, free layer 11 has a width of ~10 μm in the x-axis direction, a thickness of 15 nm in z-axis direction, and the gap between adjacent free layers in the x-axis direction is 200 nm. The neighboring soft magnetic layers 14 bridge the gap between adjacent free layers and are formed below and between them. Soft magnetic layers have a width of 700 nm, a thickness of 15 nm, and spacing of 30 nm between a top surface of layer 14 and a bottom surface of free layer 11. Layers 11 and 14 are assumed to be made of the same soft material with $B_S=1T$.

FIG. 1B shows the free layer 11 magnetization in the x-axis direction vs. the position along a width direction under a 10 Oe x-axis field, with and without a soft magnetic layer 14. Results show that the added soft magnetic layer can enhance the magnetization rotation by more than 30%. This clearly demonstrates the advantage of providing a neighboring soft magnetic film to enhance the sensitivity of a MR sensor stripe.

In summary, we have found the major advantages of the invention when using single domain narrow width MR sensors with neighboring soft magnetic patterns include the following. First, MR sensor response is more linear due to the uniform rotation of the free layer magnetization. Secondly, sensor low frequency noise is less due to the single domain free layer. Thirdly, field concentration and demagnetization cancellation by neighboring soft magnetic patterns is not limited by the MR sensor's free layer's properties so the free layer can be independently optimized to increase the sensitivity of the MR sensor.

The embodiments described below having a soft magnetic layer pattern on the sides of a MR sensor closest to the edges of the free layer, but lying below the free layer top surface as shown in FIGS. 5A-6C may be made using procedures similar to those used for hard bias deposition in the manufacture of hard drive read heads, except that the hard magnetic material is replaced by a soft magnetic material. When the free layer and soft magnetic layer are formed in the same plane, then a single deposition step may be used to deposit both layers. In other embodiments where the MR stripe is formed entirely below or above the soft magnetic layers, then separate deposition steps are required for the free layer and soft magnetic layers.

In all embodiments, the free layer thickness may be from 10 to 300 Angstroms and the soft magnetic layers (flux absorbing stripes) may have a thickness between 10 and 1000 Angstroms. Moreover, each flux absorbing stripe may have one or more layers and may be comprised of one or more elements selected from Co, Fe, Ni, B, N, Cr, Hf, Nb, and Zr.

Embodiment 1

Figure 2A:
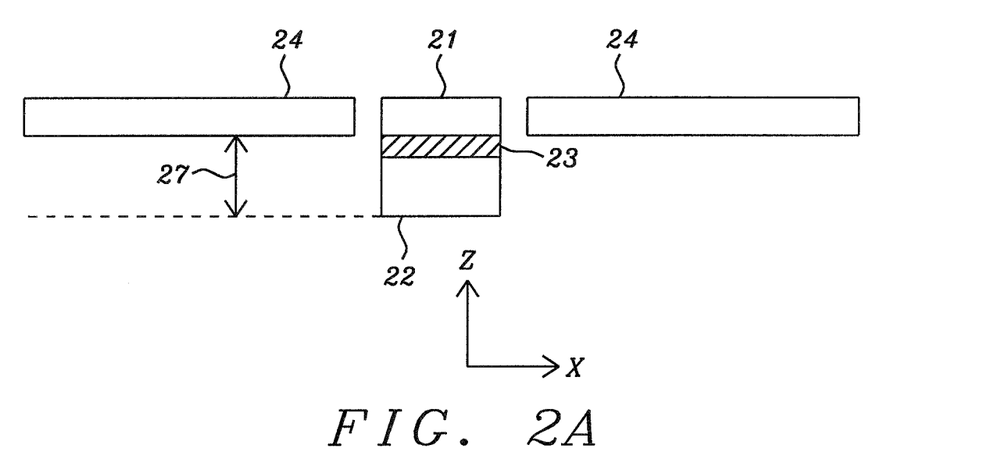
FIGS. 2A and 2B show cross-sectional and plan views, respectively, of an embodiment that represents the simplest form of the invention to implement wherein the side stripes and the free layer are formed in a single deposition.

Referring now to FIG. 2A, seen there, in cross-sectional view, are free layer 21, reference (pinned) layer 22, and spacer layer 23 that may be Cu for GMR (Giant Magneto-Resistance) and metal oxide for TMR (Tunneling Magneto- Resistance) devices which have been patterned into long stripes. For the AMR (Anisotropic Magneto-Resistance) device case, only layer 21 exists. For GMR and TMR embodiments, reference layer magnetization is pinned in the x-axis direction by one or more underlying magnetic layers (not shown). Non-sensing soft magnetic layers 24 are patterned and positioned in close proximity to the longer edges of the MR sensor.

Figure 2B:
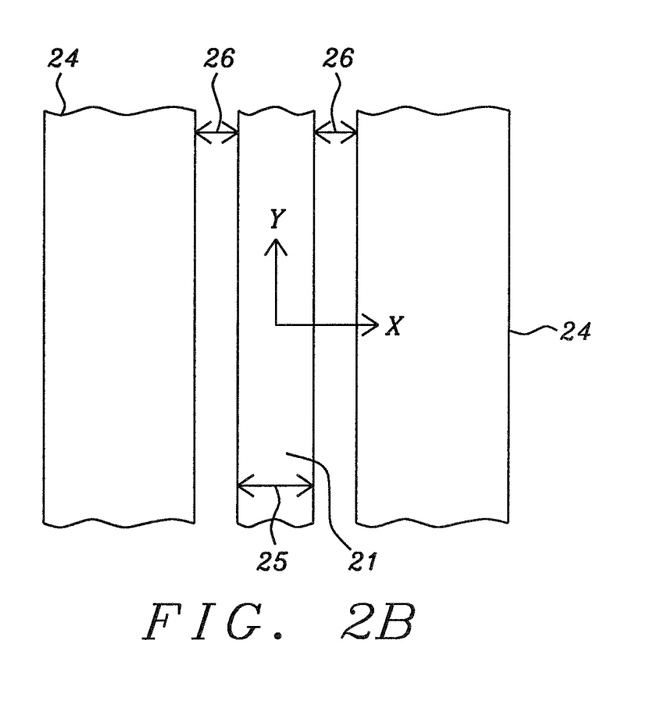

Referring to FIG. 2B, the width 25 of free layer 21 is less than the magnetic exchange length of typical free layer material, i.e. <300 nm in most cases. The aspect ratio for the free layer (thickness/width) is preferably at least 5. The MR sensor length along the y-axis direction is substantially longer than width 25 and is at least 1 μm. The soft magnetic layers also referred to as flux absorbing stripes 24 have a similar, or even greater length than the MR sensor in the y-axis direction. There is no specific width requirement for the soft magnetic layers but their width is preferably greater than width 25. The thickness of the soft magnetic layers is proximate to that of the free layer and the relative thickness of layers 21, 24 satisfies the inequality of $M_{film}t_{film} > M_{free}t_{free}$, where $M_{film}$ and $M_{free}$ are the magnetization of the soft magnetic layers and free layer, respectively, and $t_{film}$ and $t_{free}$ are the thickness of the soft magnetic layers and free layer, respectively.

The spacing 26 between flux absorbing stripes 24 and free layer 21 is no greater than twice the larger of these two thicknesses ($t_{film}$ and $t_{free}$), and is preferably less than 0.1 microns. The vertical distance 27 between a bottom surface of a soft magnetic layer and the MR sensor stack's bottom surface in FIG. 2A is such that the vertical distance between the center lines of layers 21 and 24 is within ±100% of the thickness of the soft magnetic layer. Although only a single instance of the side by side arrangement of MR stack and patterned flux absorbing stripes is shown in the figure, said arrangement can be repeated with a chosen periodicity along the x-axis direction to form multiple MR sensing stripes interleaved with multiple patterned flux absorbing stripes, with neighboring MR stripes sharing a common patterned flux absorbing stripe 24.

Embodiment 2

Figure 3A:
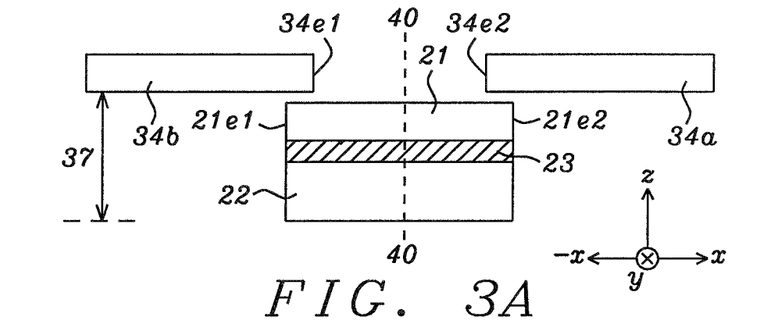
FIGS. 3A, 3B, and 3C show embodiments wherein the free layer is located below the side stripes, allowing for the possibility of the latter overlapping the former.
Figure 3B:
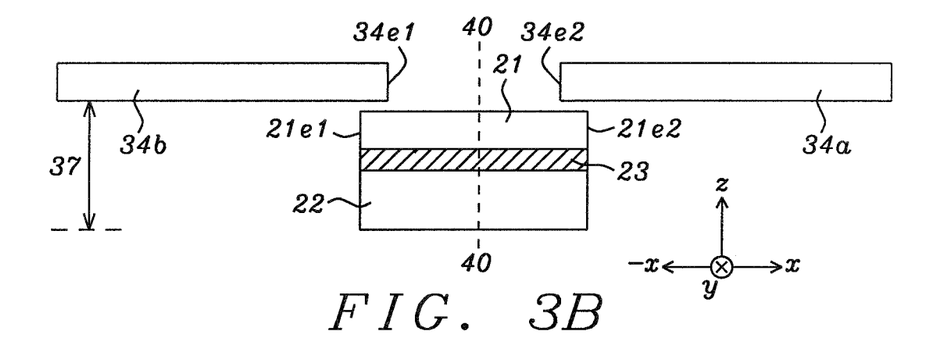
Figure 3C:
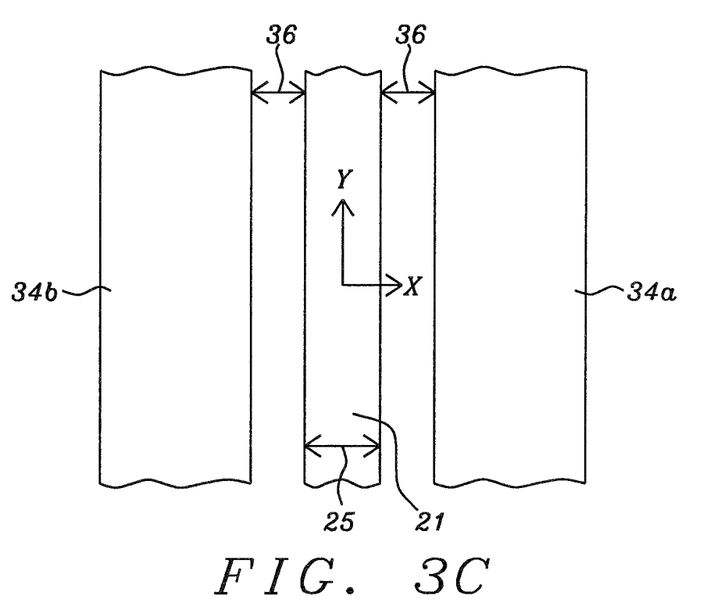

This embodiment, shown in FIGS. 3A, B, & C, is the same as Embodiment 1 except that distance 37 is equal or larger than the MR film stack and flux absorbing stripes 34a, 34b are formed entirely above a plane 41-41 that includes the top surface of free layer 21. The thickness of each flux absorbing stripe still satisfies $M_{film}t_{film} > M_{free}t_{free}$. In FIG. 3A, there is a plane 40-40 that bisects the MR stripe including free layer 21 in a lengthwise direction along the y-axis. A second edge 34e2 of a first flux absorbing stripe 34a is offset from a first edge 21e2 of the free layer along the x-axis direction that is orthogonal to plane 40-40. A second edge 34e1 of a second flux absorbing stripe 34b is offset from a first opposing edge 21e1 along a (−)x-axis direction such that there is no overlap of free layer 21 with flux absorbing stripes 34a, 34b in a z-axis direction. Note that opposing first edges 21e1, 21e2 are also formed along a side of spacer layer 23 and reference layer 22. Thus, neither of the second edges is aligned above any portion of the free layer. Distance 36 along the x-axis direction in FIG. 3C is preferred to be as close to zero as possible for good magnetostatic coupling between layers 21 and 34a, and between layers 21 and 34b.

As illustrated in FIG. 3B, distance 36 may be negative wherein a portion of flux absorbing stripe 34a including edge 34e2 is aligned above free layer 21, and a portion of flux absorbing stripe 34b including edge 34e1 is aligned above the free layer. In all embodiments, adjacent pairs of opposing first edges and second edges such as first pair 21e1, 34e1 and second pair 21e2, 34e2 are aligned parallel to each other, and adjacent edge pairs are separated from one another by a distance that is no greater than twice the larger of the free layer and flux absorbing stripe thicknesses, as measured from one of the opposing first edges in a direction parallel to said free layer top surface.

Embodiment 3

Figure 4A:
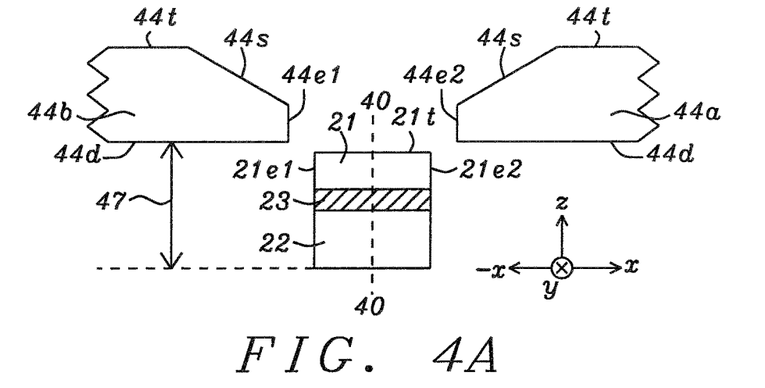
FIGS. 4A, 4B, and 4C show embodiments similar to those shown in FIGS. 3A-3C but wherein the side stripes have asymmetrically tapered edges.
Figure 4B:
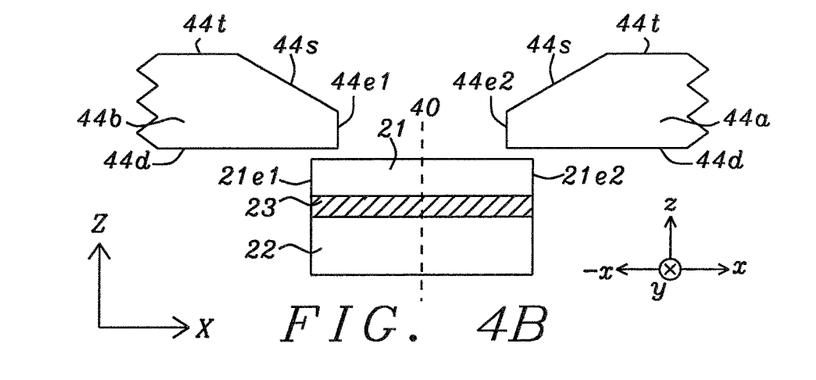
Figure 4C:
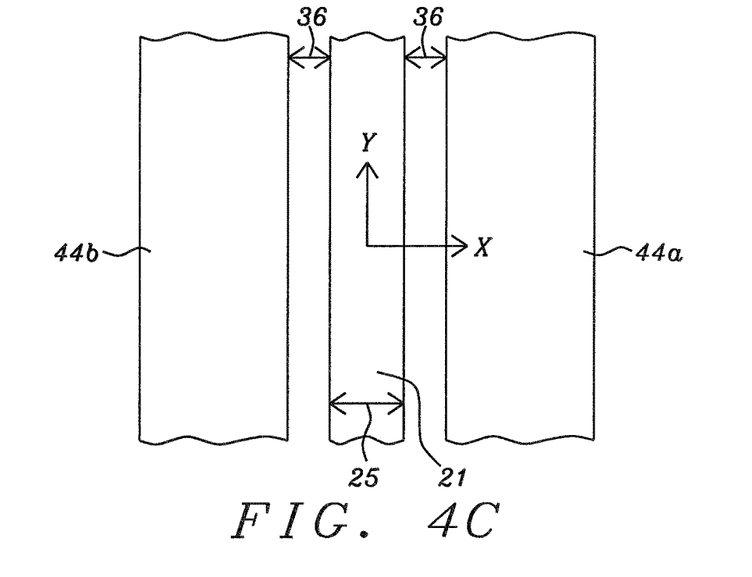

This embodiment, shown in FIGS. 4A-4C, is the same as embodiment 1 except that flux absorbing stripes 44a, 44b have asymmetrically tapered edges. The thickness of each flux absorbing stripe in a z-axis direction between bottom surface 44d and top surface 44t satisfies the requirement $M_{film}t_{film} < M_{free}t_{free}$. In FIG. 4A, there is a plane 40-40 that bisects the MR stripe including free layer 21 in a lengthwise direction along the y-axis. A second edge 44e2 of a first flux absorbing stripe 44a is offset from a first edge 21e2 of the free layer along the x-axis direction that is orthogonal to plane 40-40. A second edge 44e1 of a second flux absorbing stripe 44b is offset from a first opposing edge 21e1 of the free layer along a (−)x-axis direction. Furthermore, each edge 44s forms a sloped surface that connects an edge 21e1 or 21e2 to a top surface 44t. Note that as the distance along sloped surface 44s from edge 21e or 21e2 becomes increasingly greater, the distance between slope 44s and bottom surface 44d also becomes larger. Tapering such as sloped surfaces 44s serve to concentrate flux into free layer 21 thereby increasing sensitivity of magnetization therein to external fields.

As illustrated in FIG. 4B, distance 36 may be negative since a portion of flux absorbing stripe 44a including edge 44e2 may be aligned above free layer 21, and a portion of flux absorbing stripe 44b including edge 44e1 may be aligned above a top surface 21t of the free layer. FIG. 4C corresponds to a top-down view of the structure in FIG. 4A.

Embodiment 4

Figure 5A:
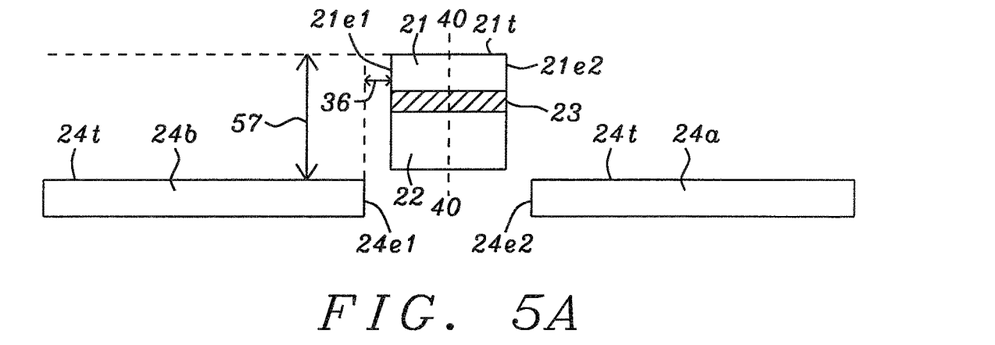
FIGS. 5A, 5B, and 5C show embodiments wherein the full MR device is located above the side stripes, allowing for the possibility of the former overlapping the latter.
Figure 5B:
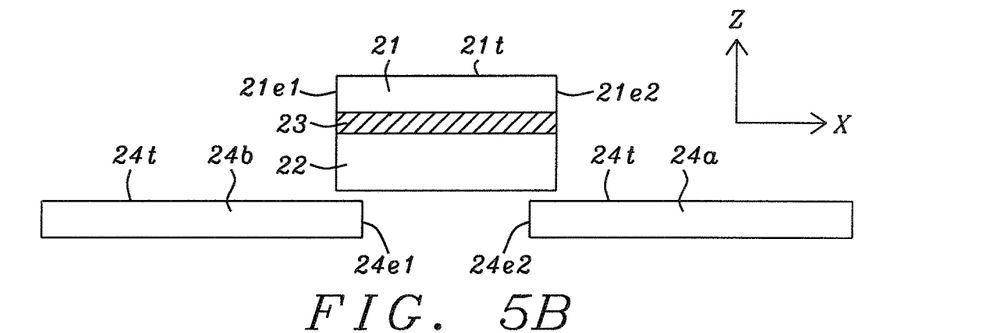
Figure 5C:
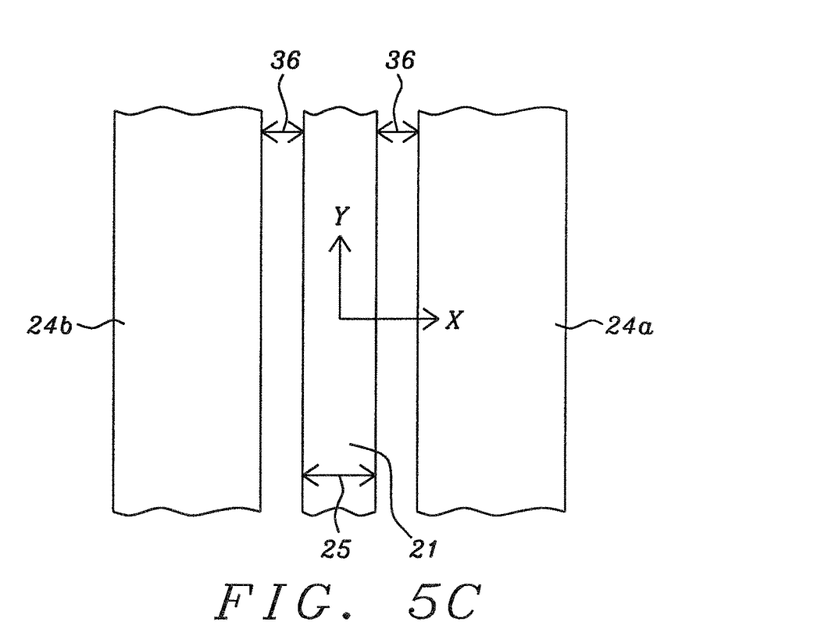

Another embodiment shown in FIGS. 5A-5C is the same as embodiment 1 except distance 57 that represents the separation between a top surface 21t of free layer 21 and a top surface 24t of flux absorbing stripes 24a, 24b is equal to or larger than the thickness of the free layer. Thus, the flux absorbing stripes are entirely formed below a plane 42-42 that includes the bottom surface of the MR stripe. The thickness of the flux absorbing stripes and free layer still satisfies $M_{film}t_{film} > M_{free}t_{free}$. Distance 36 along the x-axis direction is preferably as close to zero as possible for good magnetostatic coupling between the free layer and flux absorbing stripes. In FIG. 5A, no portion of the MR sensor or free layer is aligned above a flux absorbing stripe which means no overlap of layer 21 with layers 24a, 24b in a z-axis direction. As discussed above and depicted in the cross-sectional view in FIG. 5B, distance 36 may be negative such that portions of the free layer 21 and MR stripe are aligned above layers 24a, 24b. In other words, free layer edges 21e1 and 21e2 may be formed above a top surface 24t of the flux absorbing stripes.

Embodiment 5

Figure 6A:
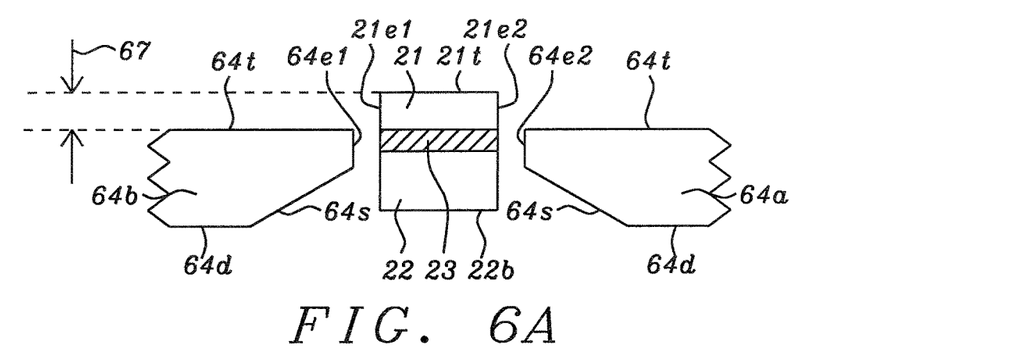
FIGS. 6A, 6B, and 6C show embodiments similar to those shown in FIGS. 5A-5C but wherein the side stripes have asymmetrically tapered edges.
Figure 6B:
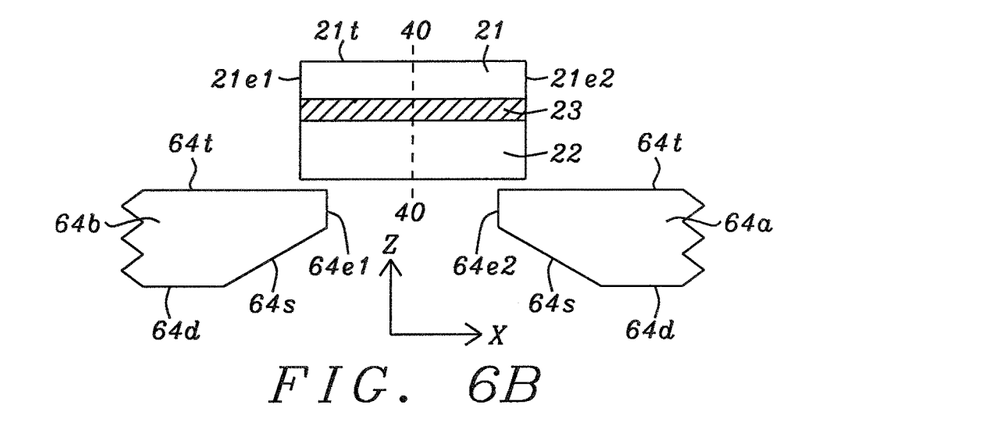
Figure 6C:
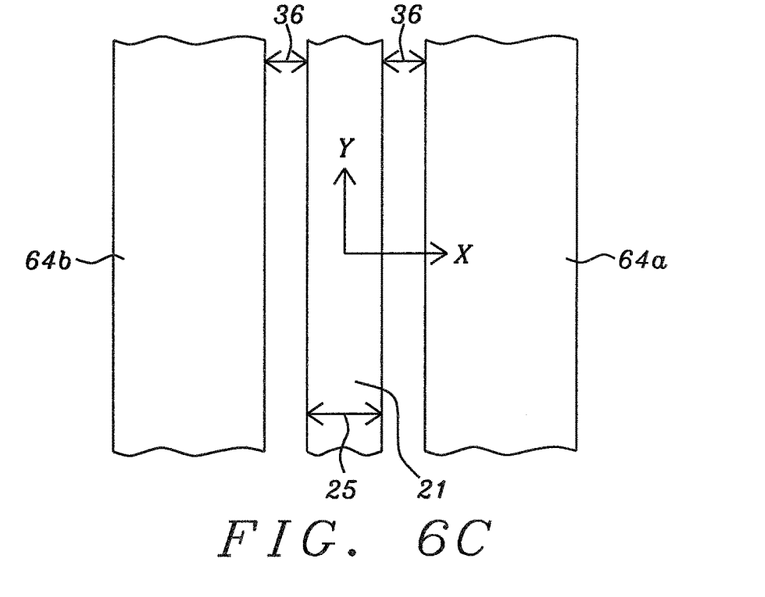

Another embodiment shown in FIGS. 6A-6C is the same as in embodiment 4 except that flux absorbing stripes 64a, 64b have asymmetrically tapered edges. Moreover, a top surface 64t of the flux absorbing stripes may be below a top surface 21t of the free layer and above a bottom surface 22b of the reference layer. The thickness of each flux absorbing stripe in a z-axis direction between bottom surface 64d and top surface 64t satisfies the requirement $M_{film}t_{film} > M_{free}t_{free}$. In FIG. 6A, there is a plane 40-40 that bisects the MR stripe including free layer 21 in a lengthwise direction along the y-axis. A second edge 64e2 of a first flux absorbing stripe 64a is offset from a first edge 21e2 of the free layer along the x-axis direction that is orthogonal to plane 40-40. A second edge 64e1 of a second flux absorbing stripe 64b is offset from a first opposing edge 21e1 of the free layer along a (−)x-axis direction. Furthermore, each edge 64s forms a sloped surface that connects an edge 21e1 or 21e2 to a bottom surface 64d. Note that as the distance along sloped surface 64s from edge 21e or 21e2 becomes increasingly greater, the distance between slope 64s and top surface 64t also becomes larger. Tapering that is represented by sloped surfaces 64s serves to concentrate flux into free layer 21, thereby increasing sensitivity of magnetization therein to external fields.

In an alternative embodiment illustrated by the cross-sectional view in FIG. 6B, the flux absorbing stripes may be formed entirely below a bottom surface of the MR stripe. Thus, edges 64e1, 64e2 are aligned below a bottom surface of reference layer 23. Distance 36 corresponding to the gap between stripe 64a (or 64b) and the MR stripe in FIG. 6A has a positive value. However, the separation between a flux absorbing stripe and MR stripe is considered to be negative in a configuration (FIG. 6B) where a portion of flux absorbing stripe 64a including edge 64e2 is aligned below free layer 21, and a portion of flux absorbing stripe 64b including edge 64e1 is aligned below a top surface 21t of the free layer.

Embodiment 6

Figure 7A:
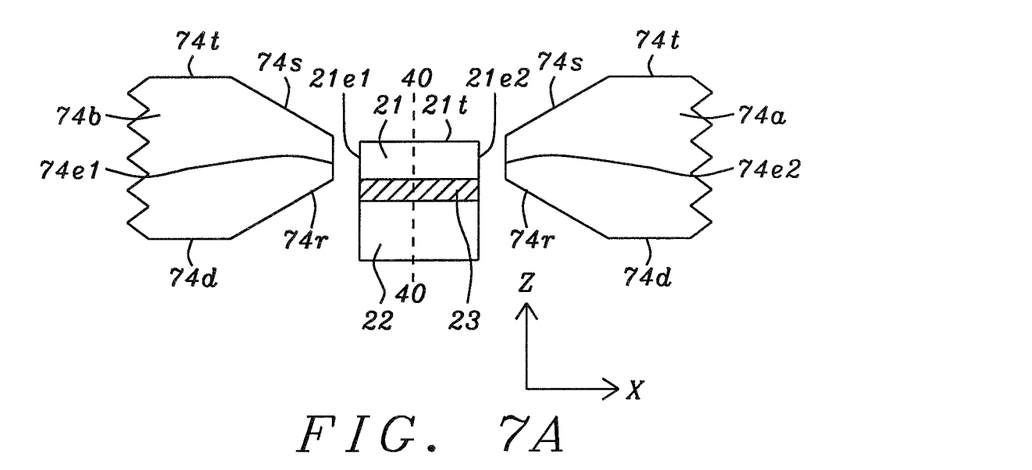
FIGS. 7A and 7B show an embodiment wherein the side stripe edges are symmetrically tapered and aligned with the free layer.
Figure 7B:
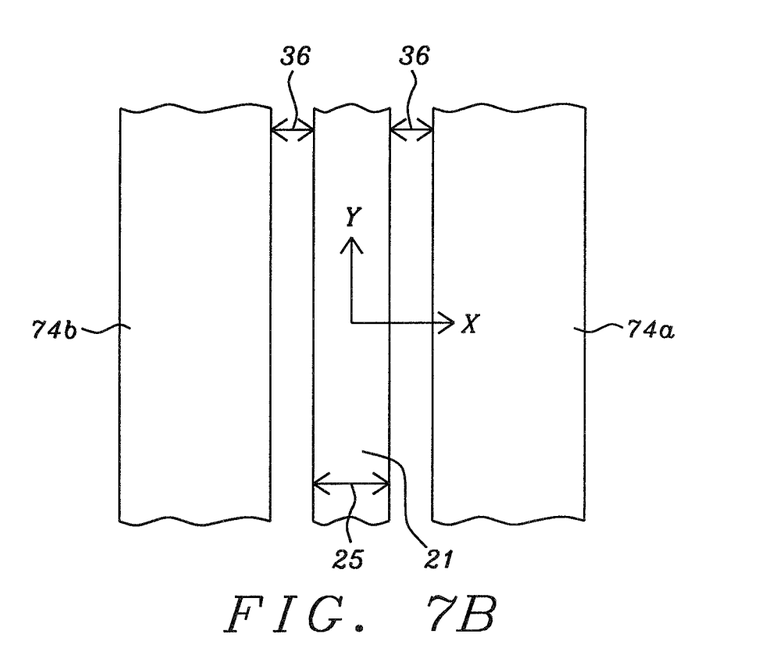

This embodiment shown in FIGS. 7A-7B is the same as embodiment 1 except that each flux absorbing stripe 74a, 74b has two symmetrically tapered edges 74r, 74s. The tapered edges 74r, 74s connect edge 74e2 to top surface 74t and bottom surface 74d, respectively, in flux absorbing stripe 74a and extend essentially an equal distance from edge 74e2. Likewise, the two tapered edges connect edge 74e1 to top surface 74t and bottom surface 74d in flux absorbing stripe 74b. According to this embodiment, edges 74e1, 74e2 preferably face free layer edges 21e1, 21e2, respectively. Therefore, the flux absorbing stripes are aligned opposite the free layer along an x-axis direction and are thinnest at edges 74e1, 74e2 and grow thicker (uniformly in both vertical directions) with increasing distance from the free layer until reaching a constant thickness value. As mentioned previously, tapered flux absorbing stripes serve to concentrate flux into the free layer thereby increasing sensor sensitivity to an external field. The thickness of flux absorbing stripes 74a, 74b satisfies the relationship $M_{film}t_{film} > M_{free}t_{free}$. Spacing 36 between layers 21 and 74a, 74b is no greater than twice the larger of the free layer thickness and thickness of the flux absorbing stripes at locations closest to the free layer.

What is claimed is:

1. A magnetic sensor, comprising:
   a magnetoresistive (MR) device comprising a plurality of layers and patterned in the form of a MR stripe having a first bottom surface, a top layer that is a magnetically free layer having a first top surface, a first thickness, an aspect ratio of at least 5, and a pair of opposing first edges that are equidistant from a center plane that bisects the MR stripe in a lengthwise direction that is perpendicular to a width of the free layer along a second direction; and
   a pair of flux absorbing stripes made of a magnetic material that comprises one or more of B, N, Cr, Hf, Nb, and Zr, and each having a second edge facing the center plane and a side of the MR stripe and aligned parallel to the opposing first edges, a second top surface, a second bottom surface, and a second thickness, and wherein a product of flux absorbing stripe magnetization times the second thickness is greater than a product of free layer magnetization times the first thickness, and each of the second edges is separated from one of the opposing first edges of the free layer by a first distance along the second direction.

2. The magnetic sensor of claim 1 wherein each of the second edges faces a side of the free layer.

3. The magnetic sensor of claim 1 wherein the first distance is less than about 0.1 microns.

4. The magnetic sensor of claim 1 wherein the first thickness is from about 10 to 300 Angstroms and the second thickness is from about 10 to 1000 Angstroms.

5. The magnetic sensor of claim 1 wherein each flux absorbing stripe is formed from one or more layers.

6. The magnetic sensor of claim 1 wherein the first top surface and the second top surface are coplanar, and the free layer has a width that is less than 300 nm.

7. The magnetic sensor of claim 2 wherein each flux absorbing stripe further comprises a tapered third edge that connects the second edge to the second bottom surface such that each flux absorbing stripe is thinnest at the second edge and becomes thicker with increasing distance from the second edge until reaching the second thickness that represents the distance between the second top surface and the second bottom surface.

8. The magnetic sensor of claim 7 further comprising a tapered fourth edge that connects the second edge to the second top surface.

9. The magnetic sensor of claim 8 wherein the tapered third edge is symmetrically shaped with respect to the tapered fourth edge, and each of the flux absorbing stripes is thinnest at the second edge and becomes thicker with increasing distance from the second edge until reaching the second thickness that represents a distance between the second top surface and second bottom surface.

* * * * *